United States Patent [19]
Hack et al.

[11] Patent Number: 5,536,932
[45] Date of Patent: Jul. 16, 1996

[54] POLYSILICON MULTIPLEXER FOR TWO-DIMENSIONAL IMAGE SENSOR ARRAYS

[75] Inventors: Michael G. Hack, Mountain View; Richard L. Weisfield, Los Altos; Robert A. Street, Palo Alto, all of Calif.

[73] Assignee: Xerox Corporation, Stamford, Conn.

[21] Appl. No.: 386,838

[22] Filed: Feb. 10, 1995

[51] Int. Cl.$^6$ ................................................ H01J 40/14
[52] U.S. Cl. ........................................ 250/208.1; 348/303
[58] Field of Search ........................... 250/208.1, 208.4, 250/208.5, 208.6, 214.1; 348/281, 283, 302, 303, 304, 307–309

[56] References Cited

U.S. PATENT DOCUMENTS

| | | | |
|---|---|---|---|
| 5,184,006 | 2/1993 | Ueno | 250/208.1 |
| 5,184,018 | 2/1993 | Conrads et al. | 250/208.1 |
| 5,315,102 | 5/1994 | Abe et al. | 250/208.1 |

OTHER PUBLICATIONS

"Laser Dehydrogenation/Crystallization of Plasma-Enhanced Chemical Vapor Deposited Amorphous Silicon for Hybrid Thin Film Transistors", Mei et al. Appl. Phys. Lett. 64 (9), Feb. 28, 1994, pp. 1132–1134.

" Journal of Non– Crystalline Solids" 164–166 (1993) 727–730, M. Hack, P. Mei, R. Lujan and A. G. Lewis, pp. 727–730, Jan. (1993).

"Two–dimensional Amorphous–Silicon Photoconducter Array for Optical Imaging", Stearns et et., Applied Optics, vol. 31, No. 32, pp. 6874–6881, Nov. 10, 1992.

"Amorphous–Silicon Linear–Array Device Technology: Applications in Electronic Copying", Weisfield, IEEE Transactions on Electron Devices., vol. 36, No. 12, pp. 2935–2939), Dec. 1989.

M. Matsumura, et al. (IEE Electron Device Letters, vol. EDL–1, pp. 182–184, Sep. 1980).

Street, et al. (Material Research Society Symposium Proceedings, vol. 192, pp. 441–452, Jan. 1990).

Powell, et al. (Material Research Society Symposium Proceedings, vol. 258, pp. 1127–1137, Jan. 1992).

Primary Examiner—Edward P. Westin
Assistant Examiner—Que T. Le
Attorney, Agent, or Firm—Fay, Sharpe, Beall, Fagan, Minnich & McKee

[57] ABSTRACT

A polysilicon multiplexer for two-dimensional image sensor arrays is provided. Multiplexing the gate and data lines of a two-dimensional image sensor array greatly simplifies the packaging required for large devices with high resolution. The multiplex transistors are polysilicon for required read out speed. The multiplexer structure of polysilicon TFTs and sensor arrays of amorphous silicon TFTs are formed on a single substrate wherein the polysilicon TFTs are formed by laser crystallization on an outer periphery of the substrate.

14 Claims, 7 Drawing Sheets

POLYSILICON MULTIPLEXER FOR TWO-DIMENSIONAL IMAGE SENSOR ARRAYS

BACKGROUND OF THE INVENTION

The present invention relates to two-dimensional imaging. More particularly, the invention relates to a device and method for forming a two-dimensional image sensor array with amorphous TFTs and polysilicon TFTs integrated on the same substrate. The polysilicon TFTs, are constructed to provide multiplexing to the data and gate lines of the image sensor, thereby reducing the number of peripheral contacts and simplifying the packaging of the image sensor.

Addressable two-dimensional image sensor arrays made from amorphous silicon were discussed by M. Matsumura et al (IEEE Electron Device Letters, vol. EDL-1, page 182, 1980) and were demonstrated by Street et al (Material Research Society Symposium Proceedings, vol. 258, page 1127, 1992). Street et al (Material Research Society Symposium Proceedings, vol. 192, page 441, 1990) describe the use of large area amorphous silicon arrays together with a suitable phosphor for x-ray imaging.

An equivalent circuit diagram of a conventional two-dimensional image sensor is depicted in FIG. 1A.

A sensor portion is a structural unit of the image sensor that comprises a substrate 10 having formed thereon a light-receiving element (photodiode) 12 which is a photoelectric transducer and a thin-film transistor (TFT) 14 which is a switching element. A plurality of such sensor portions are arranged in rows and columns in a two-dimensional matrix array to form a sensing area.

FIG. 1B illustrates an equivalent circuit diagram for one pixel of an image sensor according to the subject invention. It is to be appreciated FIG. 1B represents one type of pixel configuration and other arrangements may be used in connection with the subject invention. When light falls on a photodiode (PD) supplied with a reverse bias voltage ($V_B$), a photocurrent (ip) is generated and supplied to a photodiode capacitance ($C_{PD}$), an optional added capacitance ($C_{ADD}$), and an overlap capacitance ($C_{GD}$) of a thin-film transistor (TFT), where these capacitances are all on the PD side. The charges are stored for a predetermined time in the capacitances on the (PD) side until the TFT is switched on by the gate pulse, whereby those charges are transferred to a signal line capacitance ($C_L$) and an overlap capacitance ($C_{GS}$) of the TFT which are both capacitances on a signal line side.

Data line signals are transferred to external read out amplifiers (see for example 22 of FIG. 1A) and sensed by voltage detection or charge sensitive amplifiers. After detecting the potential ($V_L$) or charge on the signal line side following the end of charge transfer, resetting of charges are accomplished with a reset switch in order to transfer the charges generated from the PDs in the next row.

One side of the light-receiving element 12 in each sensor portion is connected to a bias line and the other side to the drain of the thin-film transistor 14. The gates of individual thin-film transistors are connected to a common gate line 16 for each row, such gate lines 16 being connected for each row to an external shift register 18 which controls the turning on and off of the thin-film transistors for each row. The source electrodes of the thin-film transistors 14 are connected to a common data line 20 for each column, such data lines 20 in turn are connected to external analog multiplexers or assorted amplifying circuitry 22 for reading out charge from the light receiving element.

In the image sensor having the configuration described above, charges are generated in the light-receiving elements 12 in accordance to the quantity of light or radiation incident on a surface and, as the thin-film transistors 14 are turned on and off, the charges are transferred sequentially into the external analog multiplexers 22 for each row, and are then read to produce output image signals.

In the conventional two-dimensional image sensor described above, the gate lines 16 (which control TFTs for each row) are provided in one-to-one correspondence with the terminals of the external shift registers 18 and, hence, it has been necessary to provide as many terminals on the external shift registers 18 as the gate lines 16. In addition, the charges generated in the sensor portions are to be read into the external analog multiplexers 22 by means of the operation of the common gate lines 16 and, hence, it also has been necessary to provide as many terminals on the external analog multiplexers 22 as the data lines 20. This results in at least n+m contacts along the edges of the image sensor, where n is equal to the number of data lines and m is equal to the number of gate lines.

It has been shown that both amorphous silicon (a-Si) and polycrystalline silicon (poly-Si) are well suited for use in large area electronic applications, such as the above-described two-dimensional image sensor and for flat panel active-matrix displays, etc. Amorphous silicon TFTs are now routinely used as the switching element in commercial products due to their ease and cost of manufacture. Amorphous silicon TFTs possess very low leakage currents, approximately $10^{-15}$ A/µm width at 10 V drain to source bias, and adequate drive currents to charge pixels in high resolution 1000 line imagers.

It is desirable to reduce the number of external connections to these arrays in order to simplify the connection between the external drive and read out electronics. Reduction at the number of external contacts requires integrating higher speed driver electronics on the same substrate as the amorphous silicon TFTs. Laser crystallized a-Si TFTs are suitable for this integration due to their high speed and similarity and process compatibility with the pixel a-Si TFTs. In large two-dimensional arrays only linear arrays of TFTs need to be crystallized to provide the peripheral driver electronics with the remainder of a-Si being maintained for their low leakage characteristics.

Fabrication of both a-Si and poly-Si TFTs on the glass substrate have been reported. Such fabrication includes integration of both poly-Si and a-Si TFTs for top-gate devices and bottom-gate devices. However, top-gate structures are known to be inferior for a-Si TFTs. Therefore, integration of both the poly-Si and a-Si TFTs for bottom-gate devices are deemed more useful. The processes for such integration differ mainly in the inclusion of a laser treatment and a hydrogen passivation step to form the polysilicon TFTs. A detailed discussion regarding this fabrication process is set forth in an article by M. Hack, P. Mei, R. Lujan, and A. G. Lewis, entitled, INTEGRATED CONVENTIONAL AND LASER CRYSTALLIZED AMORPHOUS SILICON THIN-FILM TRANSISTORS FOR LARGE AREA IMAGING AND DISPLAY APPLICATIONS, *Journal of Non-Crystalline Solids* 164–166 (1993) 727–730 and an article by P. Mei, J. B. Boyce, M. Hack, R. A. Lujan, R. I. Johnson, G. B. Anderson, D. K. Fork, and S. E. Ready, entitled, LASER DEHYDROGENATION/CRYSTALLIZATION OF PLASMAENHANCED CHEMICAL VAPOR DEPOSITED AMORPHOUS SILICON FOR HYBRID THIN-FILM TRANSISTORS, *App. Phys. Lett.* 64(9), 28 Feb., 1994, both of which are herein incorporated by reference.

An above described image sensor, formed as an N×M matrix sensor, implementing polysilicon and amorphous silicon TFTs on a single substrate has the potential for very high speed document input by contact or projection imaging. Further, applications for imaging x-rays and other ionizing radiation are expected. However, such an N×M matrix sensor array, in its simplest form still needs a total of n+m contacts along its edges. Therefore, when attempting to construct such a device of a size approximately 14"×18" or larger, with a resolution of 200 spots per inch (spi), 300 spots per inch (spi), or greater, known packaging technology is severely strained. With known fabrication technology a format of 14"×18" or larger requires the tiling of at least four (4) individual arrays. Under such an arrangement, the contacts are confined to two sides of the array, thereby requiring a pitch of 127 μm for a 200 spi array and 85 μm for a 300 spi array. This results in a major challenge for wire-bonding, increasing the cost and decreasing the efficiencies of throughput, and cannot yet be done with tape automated bonding (TAB) packaging.

The subject invention overcomes these shortcomings and others as will be set forth below.

SUMMARY OF THE INVENTION

In accordance with one aspect of the present invention, an image sensor is provided having a plurality of gate polysilicon thin-film transistors (TFTs) configured on a substrate, each polysilicon thin-film transistor connected to a corresponding one of a plurality of gate lines and gate enable clocks which are each connected to a gate of a corresponding one of the gate polysilicon TFTs. A plurality of data polysilicon thin-film transistors (TFTs) are configured on the same substrate as the gate polysilicon TFTs, each data polysilicon TFT connected to a corresponding one of a plurality of data lines and data enable clocks which are connected to a gate of a corresponding one of the data polysilicon TFTs. A matrix of amorphous silicon TFTs, configured on the same substrate as the polysilicon TFTs, are located between the gate polysilicon TFTs and the data polysilicon TFTs.

In accordance with another aspect of the present invention, the gate polysilicon TFTs are amorphous silicon TFTs located on the outer periphery of the substrate which have been laser crystallized.

In accordance with a more limited aspect of the present invention, the above-referenced image sensor includes a plurality of gate reference amorphous silicon TFTs connected to one of the plurality of gate lines, each of the gate reference amorphous silicon TFTs being connected in a permanent "on." state and arranged to connect the gate line to a predetermined $V_{off}$.

In accordance with another aspect of the subject invention, the multiplexing circuit may be configured and operated to read out an entire image with only a single exposure.

In accordance with still another aspect of the invention a poly-Si shift register is constructed on the substrate and is used for controlling the array.

One advantage of the present invention resides in reducing the amount of output contacts from the image sensor, thereby increasing the ease of packaging the image sensor.

Another advantage of the present invention resides in reading out data from the array, eliminating unwanted charge, and multiplexing the outputs.

Yet another advantage of the present invention is the high speed capabilities of the image sensor.

Still further advantages of the present invention will become apparent to those of ordinary skill in the art upon a reading and understanding the detailed description of the preferred embodiment.

BRIEF DESCRIPTION OF THE DRAWINGS

The invention may take form in various parts and arrangements of parts and in various steps and arrangements of steps. The drawings are only for purposes of illustrating a preferred embodiment and not to be construed as limiting the invention.

DETAILED DESCRIPTION OF THE PREFERRED EMBODIMENT

While the invention is described in detail below with specific references to illustrated embodiments, it is to be understood that there is no intent to limit the invention to those embodiments. On the contrary, the aim is to cover modifications, alterations and equivalents following within the spirit and scope of the invention as defined in the appended claims.

Integration of amorphous silicon (a-Si) and polycrystalline (poly-Si) devices is important for large-area electronic applications. An area of concern in such integration arises due to the atomic hydrogen (H) in the a-Si films. a-Si deposited by plasma enhanced chemical vapor deposition (PECVD) contains a large amount of H, usually about 10 at. %. Whereas H is essential for good electrical performance of a-Si devices, it causes difficulties for laser crystallization. In the laser crystallization described in the above incorporated articles, the crystallized devices are formed substantially according to conventional methods for the production of high quality a-Si TFT bottom gate structures. Both the a-Si and laser crystallized poly-Si TFTs are fabricated using known PECVD deposition and processing steps.

A particular example of such a process requires, first, a 40–150 nm metallic alloy to be patterned to form the gate electrode followed by a 100–200 nm dual layer gate dielectric consisting of a silicon nitride followed by a silicon dioxide film. Each individual insulator layer thickness depends on a required threshold voltage $V_{th}$ as the nitride films reduce $V_{th}$, and the oxide film leads to a high $V_{th}$. The goal is to obtain a dual layer dielectric that gives the correct $V_{th}$ for both the a-Si TFTs and the poly-TFTs at the same time. It is this dual layer dielectric that enables the fabrication of high performance a-Si and poly-Si TFTs together. Subsequently, 60–100 nm of a-Si is deposited. The areas on the substrate to be crystallized are then scanned three times with an excimer laser, each time with a high power so as to remove hydrogen from the film prior to complete crystallization, thereby avoiding ablation problems. After hydrogenation at 250° C. a top silicon dioxide film is deposited and then patterned using a backside exposure from the gate electrode. This protects the channel region and provides an etch stop for the $n^+$ a-Si which is used to form ohmic source and drain contacts to both the a-Si and poly-Si TFTs. Finally, metallic source and drain contacts are added and the device is passivated.

Figure 2:
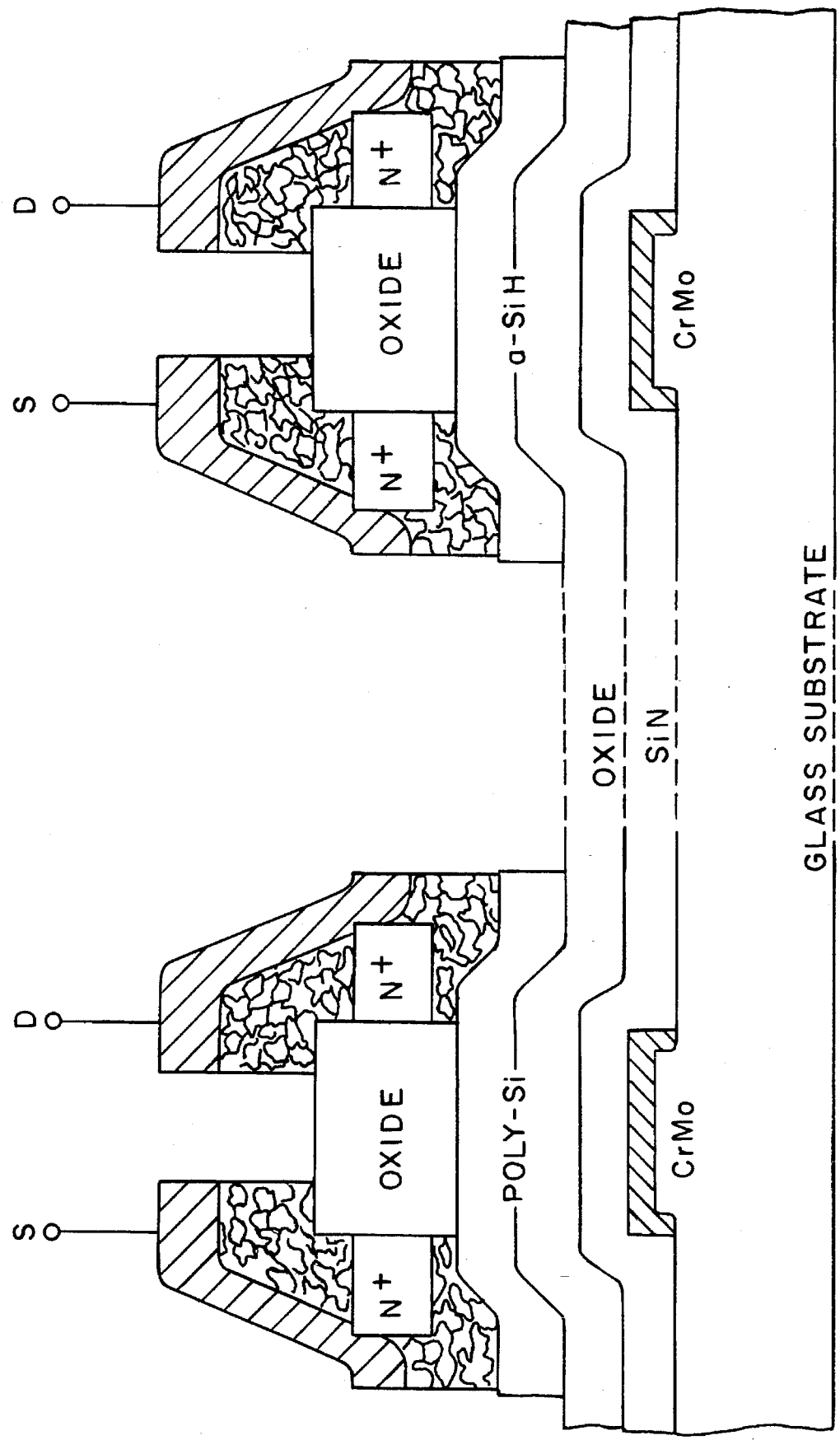
FIG. 2 is a diagrammatic illustration of the construction of a-Si and poly-Si bottom-gate TFTs.

Implementing the above laser dehydrogenation/crystallization process, n-channel bottom-gate poly-Si and a-Si TFTs have been fabricated on glass substrates. FIG. 2 provides an diagrammatic illustration of a device structure developed using the above process. The gate is formed by metal deposition and patterning. The gate insulator is comprised of silicon nitride and silicon dioxide ($SiO_2$) with silicon nitride layer adjacent to the gate electrode and the $SiO_2$ layer over the silicon nitride layer and adjacent to the TFT channel. The deposition temperature for nitride and oxide films was 350° C. This structure of the dual dielectric gate provides small and positive threshold voltage for both a-Si and poly-Si TFTs. The average substrate temperature during the selective laser dehydrogenation/crystallization process is at most at 200° C., which is well below the maximum temperature of 350° C. for the dielectric film depositions. The rest of the fabrication consists of channel protection layer of $SiO_2$, and phosphorusdoped a-Si and metal contacts for the source and drain.

It has been previously noted that by crystallizing selected patterns on the substrate high performance, high mobility TFTs operating in the range of 20–100 $cm^2/Vsec$ can be constructed.

Figure 1A:
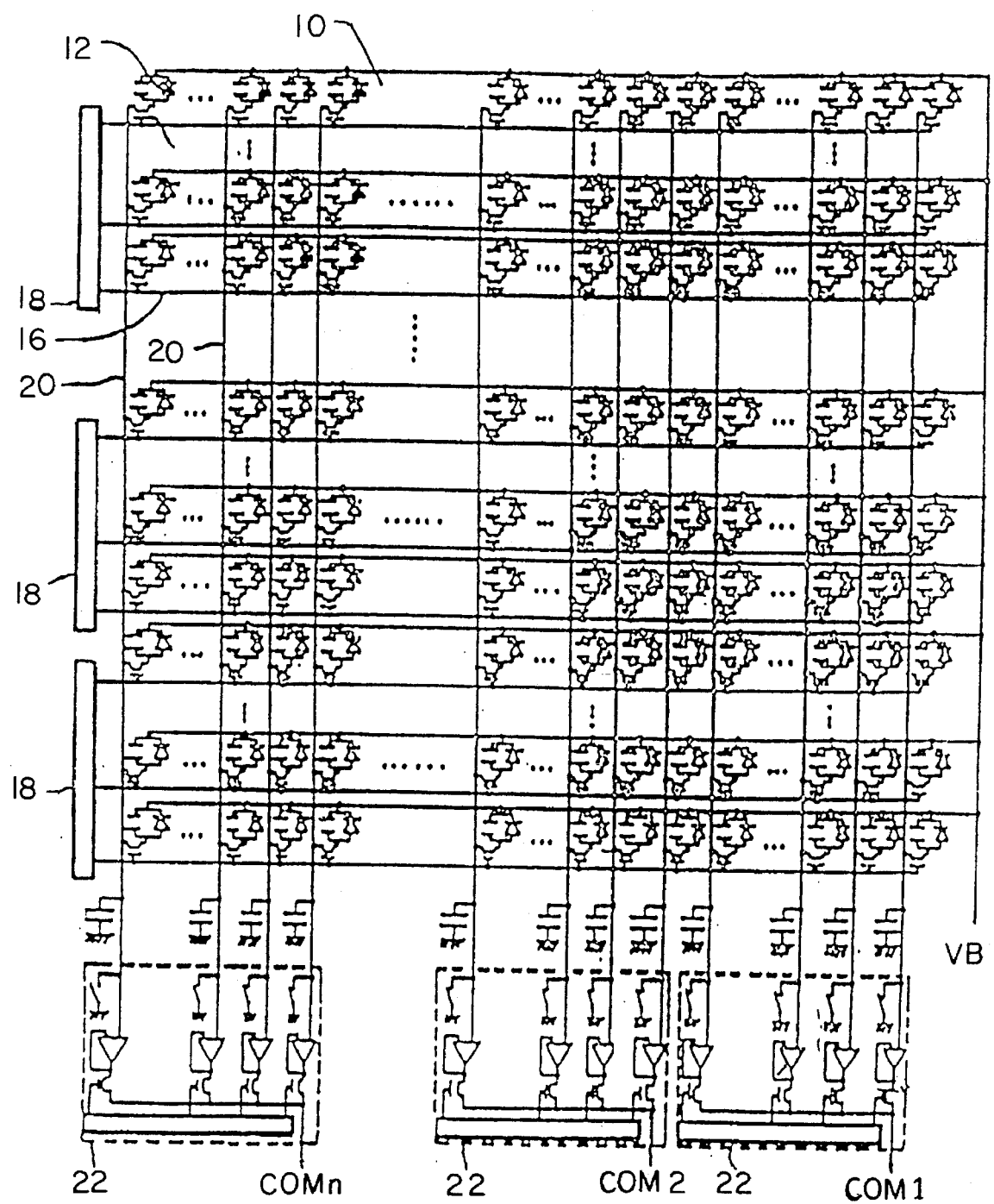
FIG. 1A is an illustration of an image sensor known in the art.
Figure 1B:
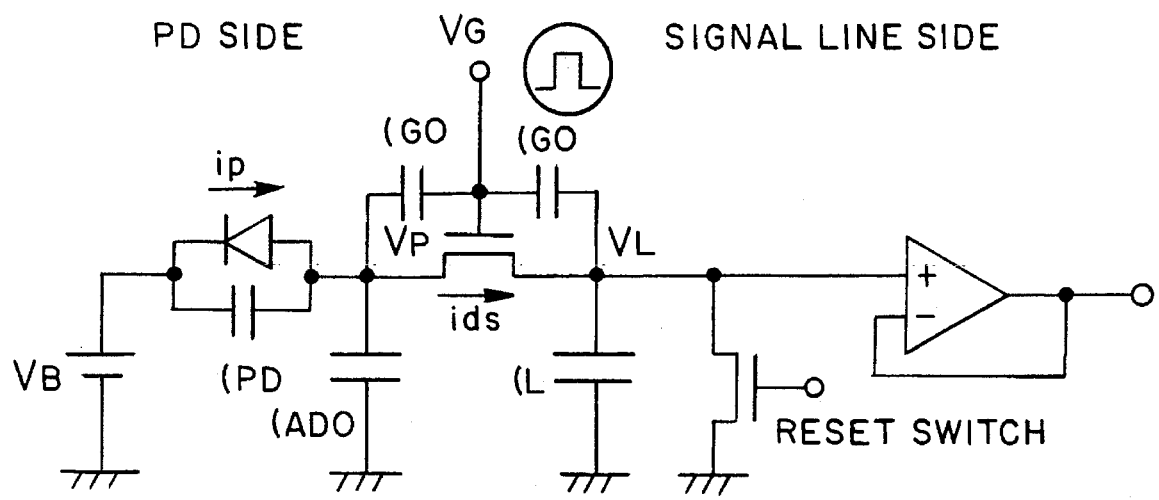
FIG. 1B illustrates a single pixel element of an image sensor such as shown in FIG. 1A.

When prior art technology such as shown in FIG. 1A is applied to the production of practical image sensors with a resolution of 200 spi, 300 spi, or greater, packaging problems exist. Particularly, though such imagers have the potential for very high speed document input by contact or projection imaging the number of contacts from the array increase the complexity and cost of manufacture. Imager arrays comprised of a N×M matrix of sensors will, in its simplest form, need a total of n+m contacts at its edges. When a device 14"×18" in size or larger with a resolution of 200 spi, 300 spi, or greater is configured, the tiling of four (4) individual arrays is presently necessary, confining the contacts to two sides of the array, with a pitch of 127 µm for a 200 spi array and 85 µm for a 300 spi array.

To overcome these problems a low level multiplexing scheme of both gate and data lines is proposed using the polysilicon TFTs as the driving circuitry of the image sensor. The remainder of the array is maintained as a-Si TFTs due to their ease and cost of manufacture as well as their low leakage currents.

Figure 3:
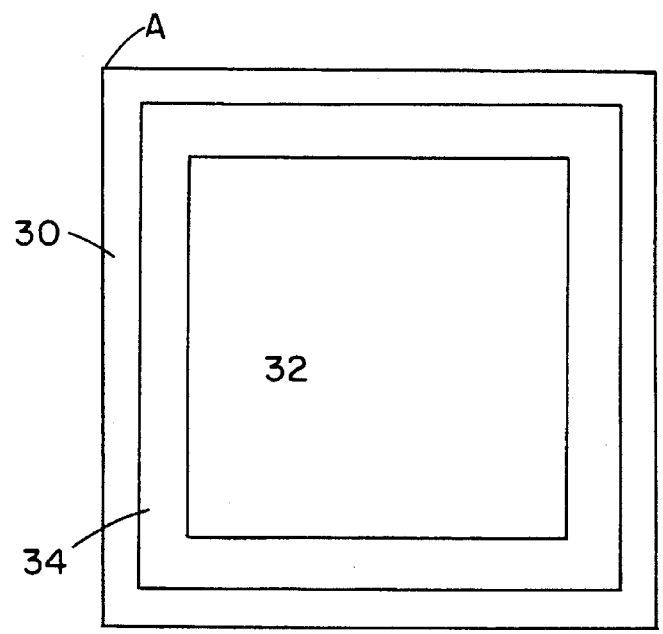
FIG. 3 is an illustration of a-Si and poly-Si TFTs integrated on a single substrate.

FIG. 3 generally depicts an image sensor according to the subject invention wherein the peripheral edges of substrate A are crystallized to form poly-Si TFTs 30, used as the driving circuitry of the image sensor. The interior or sensor array 32 of substrate A contain the pixel a-Si TFTs which have not been crystallized and act as the switching elements of the image sensor. A gap 34 between the a-Si TFTs and poly-Si TFTs of approximately 1 to 2 mm has been intentionally developed. This gap 34 provides a clear demarcation between those TFTs which have been crystallized and those which have not.

Figure 4A:
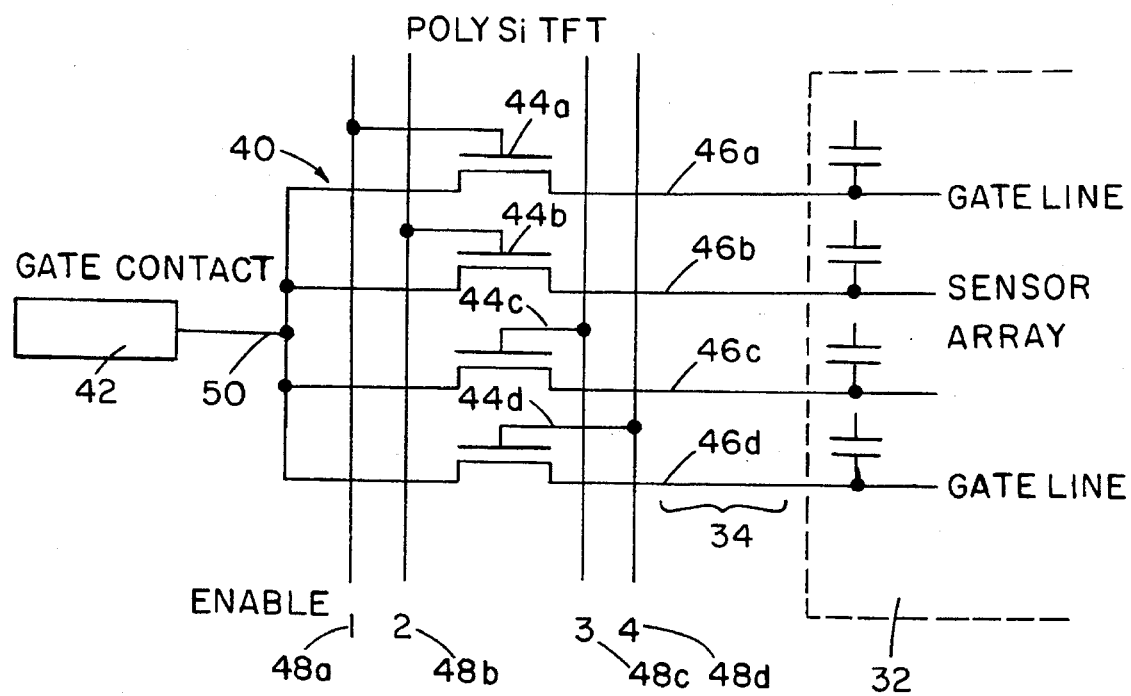
FIG. 4A is a schematic of a polysilicon TFT 4 to 1 gate multiplexing scheme.

FIG. 4A illustrates a 4 to 1 gate multiplexing scheme according to the subject invention. The gate multiplexer 40 is located between the sensor array 32 and a gate contact (or external gate terminal) 42. Gate multiplexer 40 includes four (4) polysilicon TFTs 44a–44d connected to gate lines 46a–46d from sensor array 32. The gates of polysilicon TFTs 44a–44d have their gates connected to one of four enable clock lines 14, 48a–48d. The polysilicon TFTs 44a–44d are joined together at point 50 and in turn are connected to gate contact 42.

Figure 4B:
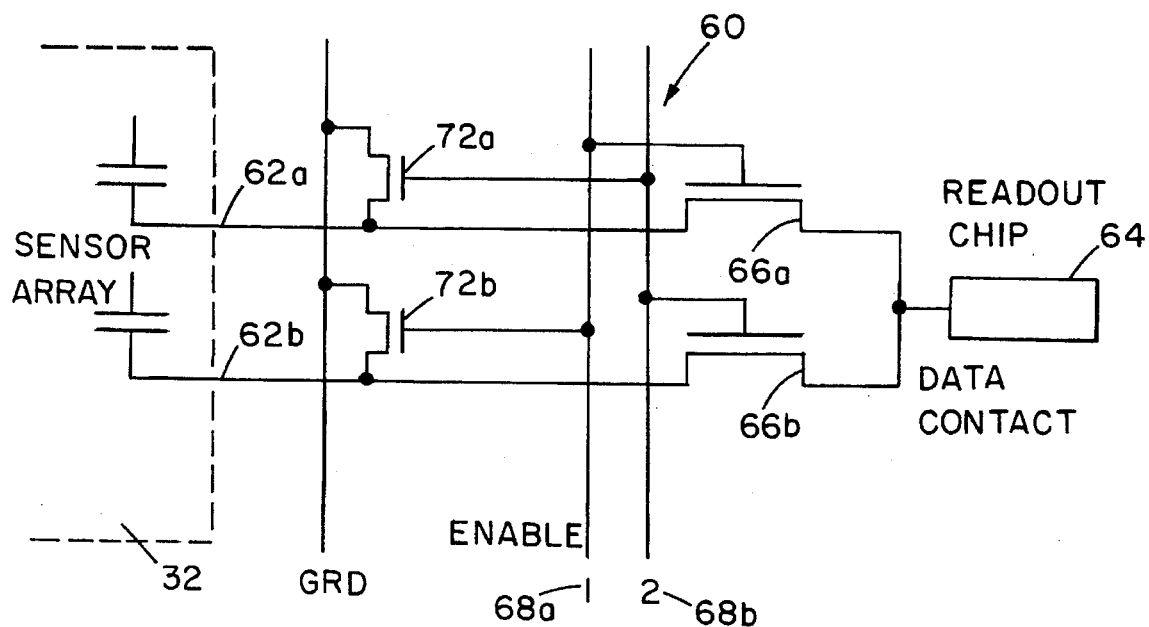
FIG. 4B is a schematic of a polysilicon TFT 2 to 1 data multiplexing scheme; and, FIG. 4C is another embodiment of the 4 to 1 multiplexing scheme depicted in FIG. 4A.

FIG. 4B shows a data multiplexer 60 designed in a somewhat similar manner as gate multiplexer 40 of FIG. 4A. Multiplexer 60 is a 2 to 1 multiplexer where two (2) data lines 62a–62b are multiplexed for output to data contact (external gate terminal) or readout chip 64. Each data line 62a–62b receives data from sensor array 32. Each data line is connected to a corresponding polysilicon TFT 66a–66b which are switched by enable clock lines 1 and 2, 68a–68b.

The above figures describe an arrangement with a 4 to 1 multiplexing scheme for gates lines, and a 2 to 1 multiplexing scheme for the data lines. It is to be appreciated, however, that other ratios are possible.

The mode of operation of multiplexers 40 and 60 is to activate clock enable 1, 68a, for the data lines, and then scan through all gate lines using the multiplexing scheme previously described. The time for such an operation is called a data subframe and in this example will be equal to ½ of an overall array refresh period. Clock enable 2, 68b, for the data lines is then activated and the entire array is rescanned.

The sequence of events of this multiplexing is now described in greater detail. The sequence of events includes clock enable 1, 48a, being activated, and all external gates being turned on in turn from an external shift register (not shown). This results in a read out of ¼ of the gate lines of A gate sub-frame, and, therefore, clock enable 1 is activated for ⅛ of the overall frame time. Following this time period clock enable 1 is deactivated, clock enable 2, 48b, is activated and all the external gates are turned on in turn from the external shift register. This is repeated for clock enable 3, 48c, and finally clock enable 4, 48d. Each array line is, therefore, driven both high and low by the external shift register (not shown).

However, for three-quarters of the time, the array gate lines are connected to gate-multiplexer TFTs which are turned off, and, therefore, these gate lines are floating. While it would be expected that the natural leakage of the polysilicon TFTs will be sufficient to maintain the TFTs in an off state, FIG. 4C provides an alternative of FIG. 4A to ensure driving of the polysilicon TFTs to an off-state.

Figure 4C:
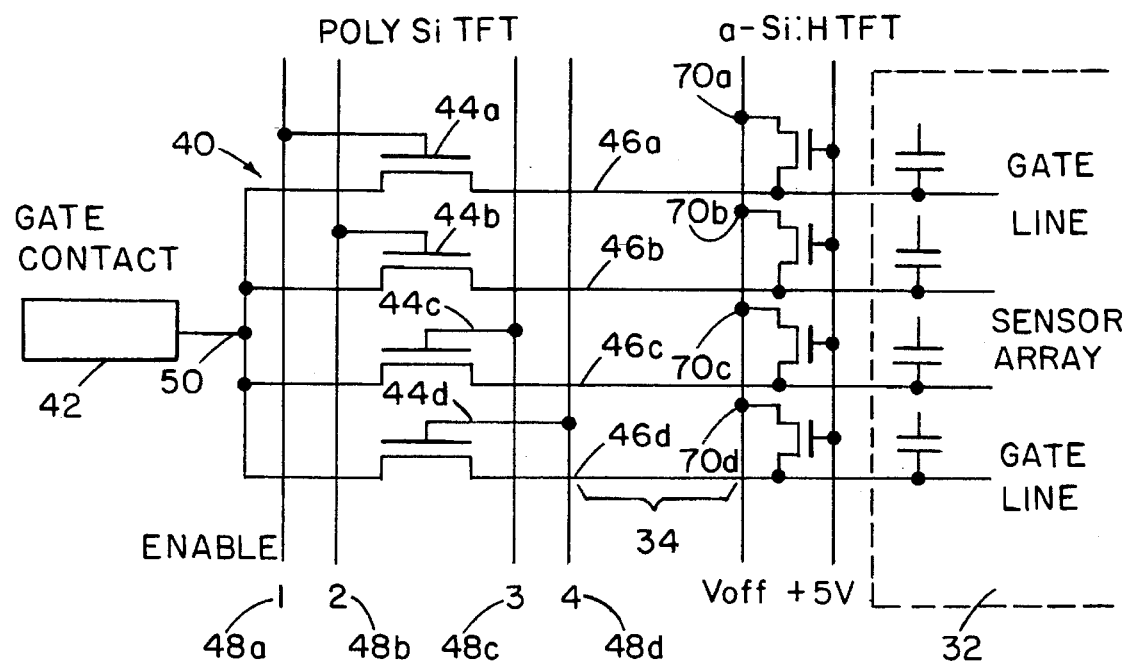

In FIG. 4C a plurality of a-Si TFTs 70a–70d are placed between polysilicon TFTs 44a–44d and the gate lines coming from sensor array 32. These a-Si TFTs provide a DC reference to a negative off-state voltage, $V_{off}$, of typically 5 volts. The a-Si:H TFTs 70a–70d are placed in a permanent "on" state, thereby connecting the gate lines to $V_{off}$ through a resistance which is typically 1–5 MΩ. The much lower resistance of the polysilicon TFTs, which is at least an order of magnitude less than the resistance of a-Si TFTs, override this voltage when it is switched on.

With further attention to the data multiplexer 60, of FIG. 4B, data clock enable 1 line 68a, is activated and held on while the entire array is scanned by the gate lines, for a subframe which is equal to ½ of the complete frame period. The second data clock enable line 68b, is then activated and the entire array is again scanned. This approach has the benefit that there is no feed-through charge onto the data lines from the polysilicon pass TFTs.

The data line that is not enabled will charge-up due to charge transferred from the pixels. If the charge does not leak away problems may arise. Therefore, if necessary, the charge can be removed by connecting a second set of TFTs 72a–72b to the data line as shown in FIG. 4B. Those TFTs are open to ground on the line that is not enabled and closed on the enabled data line. Since the required current flow is small, it is sufficient that this a-Si:H TFT rather than a polysilicon TFT, be used.

With particular attention to the embodiments shown in FIGS. 4A, 4B and 4C it is assumed that a 4000×4000 pixel array with 400 spi resolution is desired. It is further assumed the pixel capacity is roughly 0.5 pF, the capacitance of the gate and data lines is roughly 100 pF, and the frame time is 200 msec, which corresponds to 300 pages per minute. This represents a resolution and frame rate at the upper end of performance requirements for document scanning. Since there are two data sub-frames, the line time is approximately 25µ sec (2×10⁻³/(2×4000) sec), and the gate pulse length is 12µ sec. In order to switch the gate line properly, an RC time constant should be no more than about 2µ sec, so that the on-resistance of the TFTs need to be $5×10^3$ Ω. This requires a TFT width/length (W/L) of approximately 50, assuming a mobility of 20 cm² Vsec which is typical for laser crystallized polysilicon.

Within the line time estimated above, the readout chip 64 needs to sample the data line once or twice, depending on the specific design, and apply a reset pulse that discharges the data line. Thus, the RC time constant of the data line need to be approximately 0.25 microseconds., which requires an on-resistance of the TFTs to be $2.5×10^3$ Ω. The TFTs, therefore, needs to have a W/L approximately 100, which would require W=1 mm for a 10 µm channel length. If necessary, the readout chip could be designed to allow more time for the voltages to settle.

In order to fabricate multiplexers 40 and 60, the polysilicon TFTs must be sufficiently far from the array 32 that the lasering process does not crystallize the sensor TFTs. A few millimeters spacing, 1 to 2 millimeters as depicted by gap 34 is believed to be sufficient and is consistent with a convenient size of the contact region.

It is noted that a further advantage of the subject invention is that lower resolution images at higher frame rates can readily be achieved. By tying all of the enable lines high, the photosignals from adjacent pixels are combined on each readout line so as to average the image over continuous groups of 4×2 pixels. In this example, one can obtain a coarser 1000×2000 pixel image at an eight times faster frame rate of 40 Hz, which could be displayed as live video on a high resolution display. It is to be appreciate faster frame rates can be achieved with higher degrees of multiplexing.

Figure 5A:
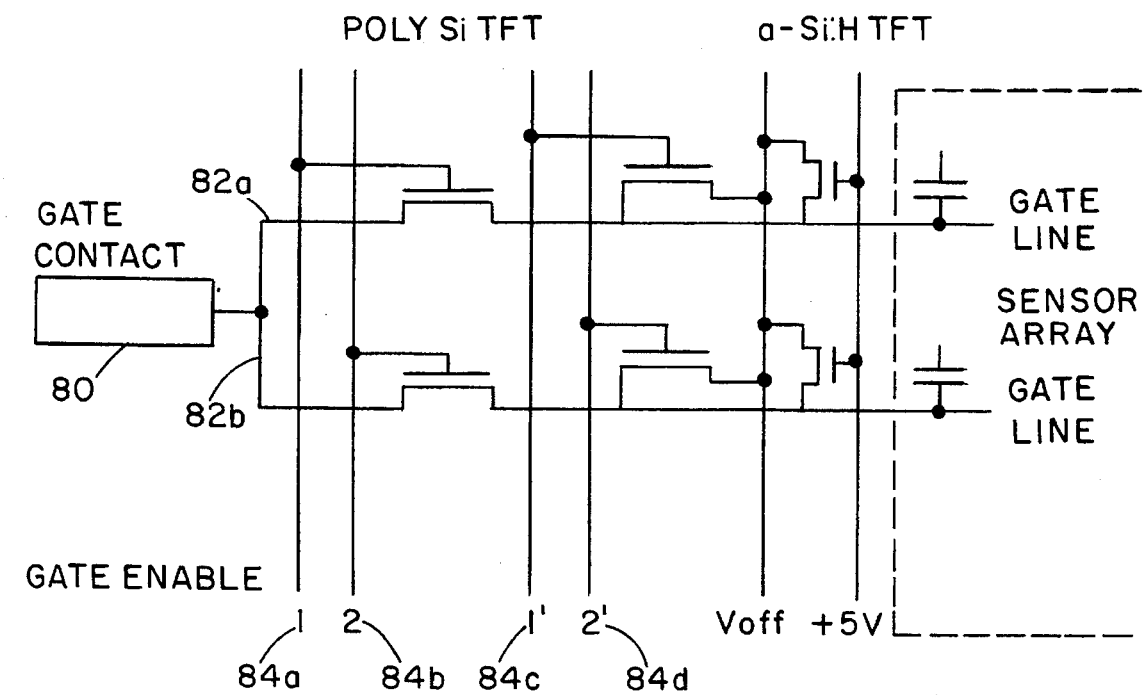
FIG. 5A is a gate multiplexing scheme wherein only a single exposure of the image sensor is necessary to read out all image date; and, FIG. 5B is a timing chart for the operation of the gate multiplexing scheme of FIG. 5A.
Figure 5B:
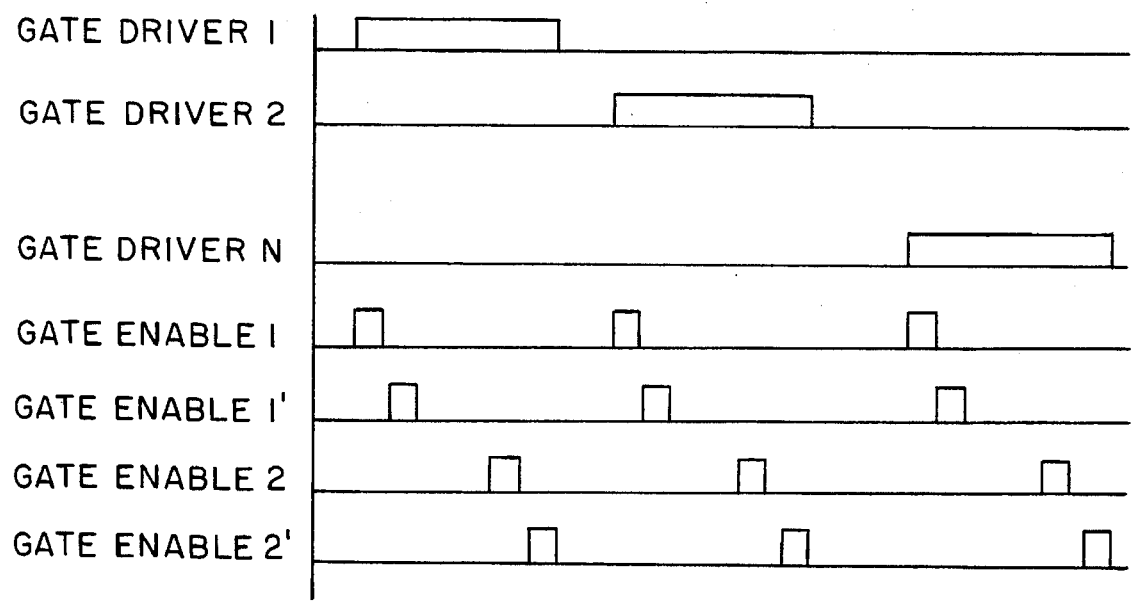
FIG. 5C is a timing chart for the multiplexing operation requiring a single exposure of the image sensor.
FIG. 5D provides an alternative circuit configuration of the data multiplexing scheme which requires a single exposure of the image sensor.

It is also determined that a configuration of the a-Si and poly-Si array of the image sensor may be developed where a single flash exposure of light may be used, whereafter the entire array is read out at one time. It is further valuable that the gate lines are addressed in sequential order rather than in four cycles. Such an array is valuable, for instance in connection with medical imaging applications where it is desirable to avoid a plurality of exposures of radiation to a patient. This alternative scheme is implemented using a gate multiplexing arrangement, as shown in FIG. 5A, where each gate driver 80 addresses two gate lines 82a, 82b. FIG. 5B depicts the timing sequence which allows a reading out of an entire image with a single exposure. Gate enable lines 84a–84d are pulsed in sequence such that "on" and "off" voltages from the gate driver 80 are scanned in a single frame. It is to be appreciated while for ease of explanation, this example has relied on a 2 to 1 gate multiplexing scheme additional levels of multiplexing are possible.

Figure 5C:
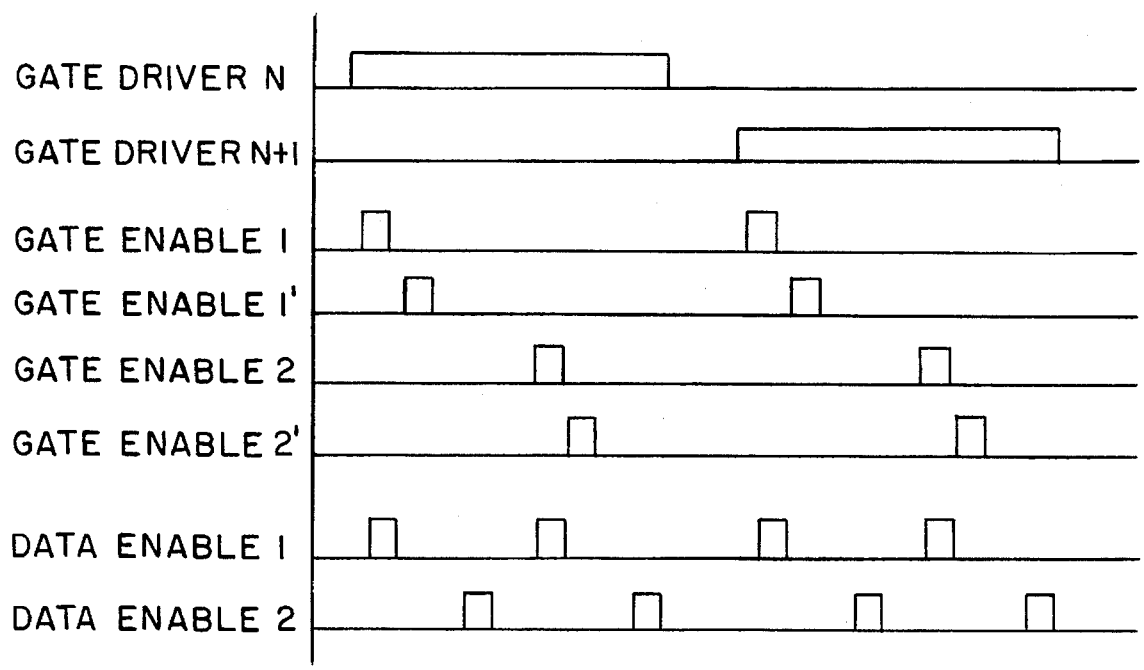
Figure 5D:
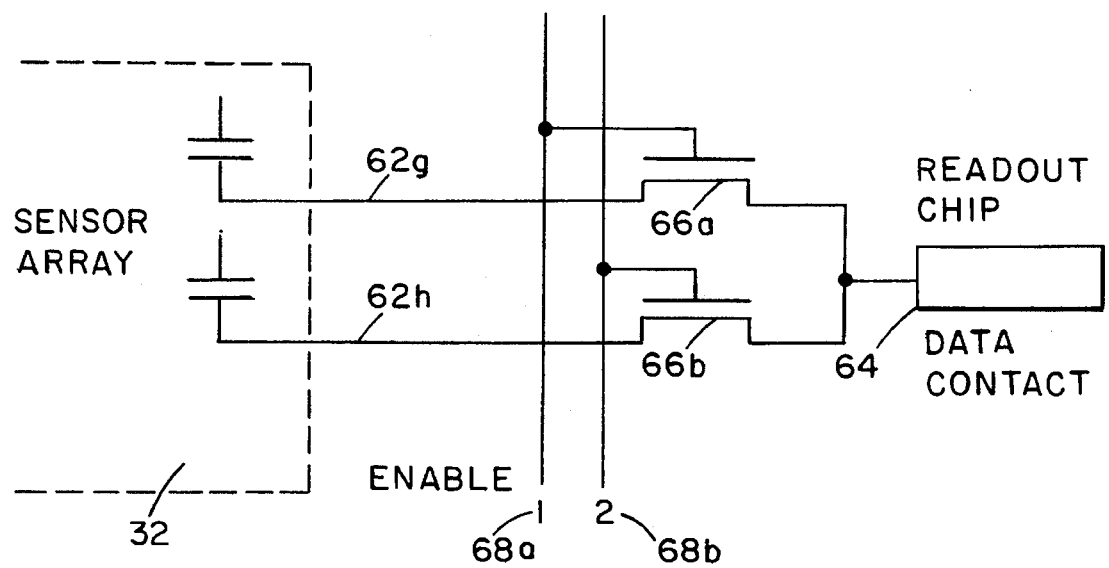

The data multiplexing for such a single exposure situation can be accomplished by using the data multiplexer arrangement shown in FIG. 4B. In this case, the data lines, 62a–62b, are successively enabled during each gate enable period, to allow the output from the array to be fully read out during a single exposure period. The timing chart to achieve such a read-out in the present example is provided by FIG. 5C. It is to be further appreciated that since all data lines are read out during each gate enable period a data multiplexer of the type disclosed in FIG. 5D which does not require the a-Si TFTs, (72a–72b, in FIG. 4B) may be used.

Figure 6A:
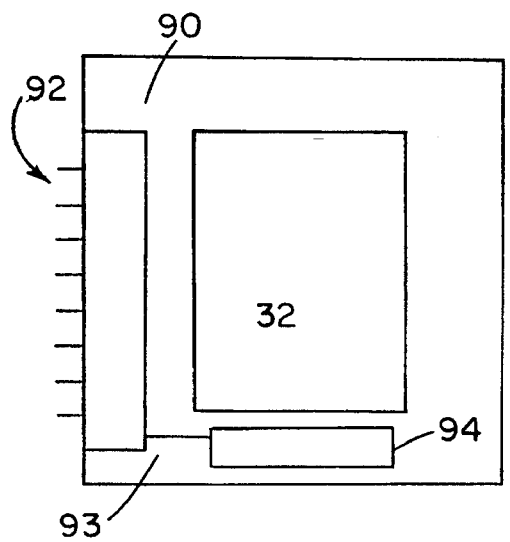
FIG. 6A depicts the image sensor with laser crystallized TFTs configured as a shift register.

FIG. 6A depicts another embodiment of the subject invention wherein the laser crystallized TFTs are constructed as on-board shift register 90. Therefore, instead of taking the external gate drives and putting the gate signals into multiplexers, the on-board shift register 90 is used to provide for all gate lines of the image sensor. FIG. 4A illustrates the gate multiplexer with one gate contact 42 for the gate drive which comes in and drives four lines, therefore, if there were 4000 gate lines it would be necessary to have 1000 gate contacts for the 4000 gate lines. In the embodiment of FIG. 6A, rather then the above FIG. 4A configuration, shift register 90 has 8 external connections 92 working together with clock control signals from lines 93 generated by clock generator 94, which can be used to drive the gate lines of array 32 i.e. the 4000 gate lines. The shift register would have a very large number of poly-Si TFTs, constructed in a known shift register arrangement. Initially, shift register 90 would be formed as a-Si TFTs on the same substrate as the a-Si used in the sensor array. Then the previously described crystallization process would be undertaken to convert the TFTs of the shift register to poly-Si TFTs.

Figure 6B:
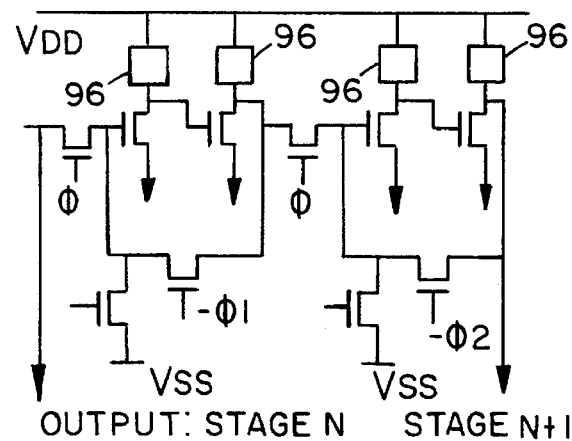
FIG. 6B provides a more detailed illustration of one stage of a shift register such as that shown in FIG. 6A.

FIG. 6B provides an illustration of one stage of shift register 90. According to a shift register constructed according to FIG. 6A for a supply voltage $V_{DD}$ of twenty (20) volts, operation can be achieved up to 50 kHz. In FIG. 6B, 96 represents NMOS loads, $\theta_1$ and $\theta_2$ are out of phase clocks, and $-\theta_1$ and $-\theta_2$ are their inverse signals. Shift register 90 may be configured in multiple stages using the above illustration. It is to be appreciated other shift register configurations are known in the art may also be used.

The subject invention has been described for an array which uses a-Si TFTs and a-Si photodiodes. It is to be appreciated, an array comprised of other elements may be used, such as photodiode switching elements and photoconductors. Further, it may be possible to use other materials to construct the elements in the matrix.

The invention has been described with reference to the preferred embodiments. Obviously modifications and alterations will occur to others upon the reading and understanding of this specification. It is intended that all such modifications and alterations are included insofar as they come within the scope of the appended claims or the equivalents thereof.

Having thus described the invention, we now claim:

1. An image sensor array comprising:

an external gate terminal;

a plurality of array gate lines each in operative connection with the external gate terminal;

a plurality of multiplexed gate polysilicon thin-film transistors (TFTs) configured on a substrate, each polysilicon TFT in operative connection with a corresponding one of the plurality of gate lines;

a plurality of gate enable lines each in operative connection with a gate of a corresponding one of the gate polysilicon TFTs;

a plurality of array data lines; and a matrix of amorphous silicon TFTs and sensors configured on the substrate, the amorphous silicon TFTs located at intersections of the gate lines and the data lines.

2. The image sensor array according to claim 1 further comprising:

an external data terminal;

the plurality of array data lines each in operative connection with the external data terminal;

a plurality of multiplexed data polysilicon thin-film transistors (TFTs) configured on the substrate, each polysilicon TFT in operative connection with a corresponding one of the plurality of data lines; and a plurality of data enable clocks each in operative connection with a gate of a corresponding one of the data polysilicon TFTs, wherein the matrix of amorphous silicon TFTs configured on the substrate are located between the gate polysilicon TFTs and the data polysilicon TFTs.

3. The image sensor array according to claim 1 wherein the polysilicon gate TFTs are amorphous silicon TFTs which have been laser crystallized.

4. The image sensor array according to claim 1 wherein the polysilicon gate TFTs are located at outer edges of the substrate.

5. The image sensor array according to claim 1 further including a plurality of separate image sensor arrays combined to form an image sensor system.

6. The image sensor array according to claim 1 wherein the array has a resolution of at least 200 spots per inch.

7. The image sensor array according to claim 1 wherein a-Si TFTs and poly-Si TFTs are constructed to include a gate insulator consisting of silicon nitride and silicon dioxide.

8. The image sensor according to claim 1 further including a plurality of a-Si TFTs each connected to one of the plurality of gate lines, each of the plurality of a-Si TFTs each connected to one of the plurality of gate lines also connected in a permanent "on" state, connected to $V_{off}$ and arranged to connect one of the gate lines to $V_{off}$ through one of the a-Si TFTs connected to $V_{off}$.

9. The image sensor according to claim 8 wherein resistance of one of a-Si TFTs connected to $V_{off}$ is at least an order of magnitude greater than a resistance of the corresponding poly-Si TFT, such that when the corresponding poly-Si TFT is selected the resistance of the poly-Si TFT overrides a voltage applied to place the poly-Si TFTs to an off state.

10. The image sensor according to claim 2 further including a plurality of a-Si TFTs, which provide a path to ground, each a-Si TFT corresponding to one of the data lines and each of the a-Si TFTs being configured to be open to ground on the data line that is not enabled and closed to the enabled data line.

11. The image sensor according to claim 1 wherein the multiplexed gate poly-Si TFTs and the plurality of gate enable lines are replaced with a poly-Si shift register and poly-Si shift register enable lines to address each of the gate lines.

12. The image sensor according to claim 2 wherein multiplexed gate and data TFTs are configured and driven to read out an entire image of the image sensor array with a single exposure of the array.

13. An image sensor array comprising:

a plurality of array gate lines;

an external data terminal;

a plurality of array data lines each in operative connection with the external data terminal;

a plurality of multiplexed data polysilicon thin-film transistors (TFTs) configured on a substrate, each polysilicon TFT in operative connection with a corresponding one of the plurality of data lines;

a plurality of data enable clocks each in operative connection with a gate of a corresponding one of the data polysilicon TFTs; and a matrix of amorphous silicon TFTs configured on the substrate, the amorphous silicon TFTs located at intersections of the gate lines and the data lines.

14. The image sensor array according to claim 13 further comprising:

an external gate terminal;

the plurality of array gate lines in operative connection with the external gate terminal;

a plurality of multiplexed gate polysilicon thin-film transistors (TFTs) configured on the substrate, each polysilicon TFT in operative connection with a corresponding one of the plurality of gate lines; and a plurality of gate enable clocks each in operative connection with a gate of a corresponding one of the gate polysilicon TFTs, wherein the matrix of amorphous silicon TFTs configured on the substrate are located between the gate polysilicon TFTs and the data polysilicon TFTs.

* * * * *